United States Patent
Boss

(10) Patent No.: US 7,642,886 B2
(45) Date of Patent: Jan. 5, 2010

(54) OPERATING DEVICE FOR AN ELECTRICAL APPLIANCE AND OPERATING METHOD

(75) Inventor: Roland Boss, Walzbachtal-Jöhlingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 88 days.

(21) Appl. No.: 11/855,242

(22) Filed: Sep. 14, 2007

(65) Prior Publication Data
US 2008/0068117 A1    Mar. 20, 2008

(30) Foreign Application Priority Data
Sep. 18, 2006    (DE) .................. 10 2006 045 735

(51) Int. Cl.
  *H01H 9/00*    (2006.01)
  *H01H 3/12*    (2006.01)
  *H01H 13/14*    (2006.01)
(52) U.S. Cl. .................. 335/205; 335/206; 335/207; 200/341
(58) Field of Classification Search ......... 335/205–207; 324/207.2
See application file for complete search history.

(56) References Cited

U.S. PATENT DOCUMENTS

| | | | |
|---|---|---|---|
| 2,803,720 A | | 8/1957 | Mason |
| 2,935,583 A | | 5/1960 | Howell |
| 2,985,734 A | | 5/1961 | Howell et al. |
| 3,748,415 A | * | 7/1973 | Suzuki ............ 200/61.45 M |
| 4,054,944 A | * | 10/1977 | Lau ............ 335/207 |
| 4,158,216 A | | 6/1979 | Bigelow |
| 4,453,148 A | * | 6/1984 | Norakidze et al. ......... 335/205 |
| 4,523,083 A | * | 6/1985 | Hamilton ............ 219/433 |
| 5,370,015 A | | 12/1994 | Moscatelli |
| 5,646,587 A | | 7/1997 | Miyazawa et al. |
| 5,920,131 A | | 7/1999 | Platt et al. |
| 6,060,969 A | * | 5/2000 | Hufgard et al. ............ 335/207 |
| 6,153,837 A | | 11/2000 | Garcia et al. |
| 6,380,733 B1 | * | 4/2002 | Apel et al. ............ 324/207.2 |
| 6,498,326 B1 | | 12/2002 | Knappe |

(Continued)

FOREIGN PATENT DOCUMENTS

DE    1143565    2/1963

(Continued)

OTHER PUBLICATIONS

German Search Report for German Application No. 102006045735.8.

(Continued)

*Primary Examiner*—Elvin G Enad
*Assistant Examiner*—Alexander Talpalatskiy
(74) *Attorney, Agent, or Firm*—Alston & Bird LLP

(57) ABSTRACT

An operating device for an electric hob has an operating element for performing operating functions, which is rotatable and rests in a removable manner on a support. The operating element is configured to be shape-variable, such as being compressible, such that it can be pressed onto the support. Upon approaching the support, a control indication is detected for initiating a further operating function of the electric hob as a consequence of the detection of said approach. In one embodiment, the underside of the operating element is made from elastic foam material.

22 Claims, 4 Drawing Sheets

U.S. PATENT DOCUMENTS

| | | | |
|---|---|---|---|
| 6,636,135 B1 * | 10/2003 | Vetter | 335/205 |
| 6,759,933 B2 * | 7/2004 | Fallak | 335/207 |
| 6,812,435 B2 | 11/2004 | Schilling | |
| 6,838,785 B2 | 1/2005 | Schilling | |
| 6,867,379 B2 | 3/2005 | Hayashi | |
| 6,922,573 B2 * | 7/2005 | Hijii | 455/575.3 |
| 6,966,781 B1 | 11/2005 | Bullinger et al. | |
| 7,069,090 B2 | 6/2006 | Huffington et al. | |
| 7,109,469 B2 * | 9/2006 | Hayashi | 250/221 |
| 2003/0224737 A1 | 12/2003 | Yokoji et al. | |
| 2003/0230470 A1 | 12/2003 | Galli | |
| 2006/0267962 A1 | 11/2006 | Baier | |
| 2007/0181410 A1 | 8/2007 | Baier | |

FOREIGN PATENT DOCUMENTS

| | | |
|---|---|---|
| DE | 1590371 | 6/1970 |
| DE | 8535821 | 2/1986 |
| DE | 290 743 | 6/1991 |
| DE | 4432399 | 3/1996 |
| DE | 199 06 365 A1 | 8/2000 |
| DE | 199 22 638 A1 | 11/2000 |
| DE | 10035642 | 12/2001 |
| DE | 100 35 592 A1 | 1/2002 |
| DE | 10151016 | 4/2003 |
| DE | 10212953 | 10/2003 |
| DE | 202004017133 | 3/2005 |
| DE | 10 2004 020 825 A1 | 12/2005 |
| DE | 10 2005 049 995 A1 | 4/2007 |
| FR | 1 330 818 | 6/1963 |
| GB | 410372 | 5/1934 |
| GB | 2 410 541 B | 6/2006 |
| WO | WO 2006/108619 A1 | 10/2006 |

OTHER PUBLICATIONS

European Search Report for European Application No. 07016405.8-1266.

* cited by examiner

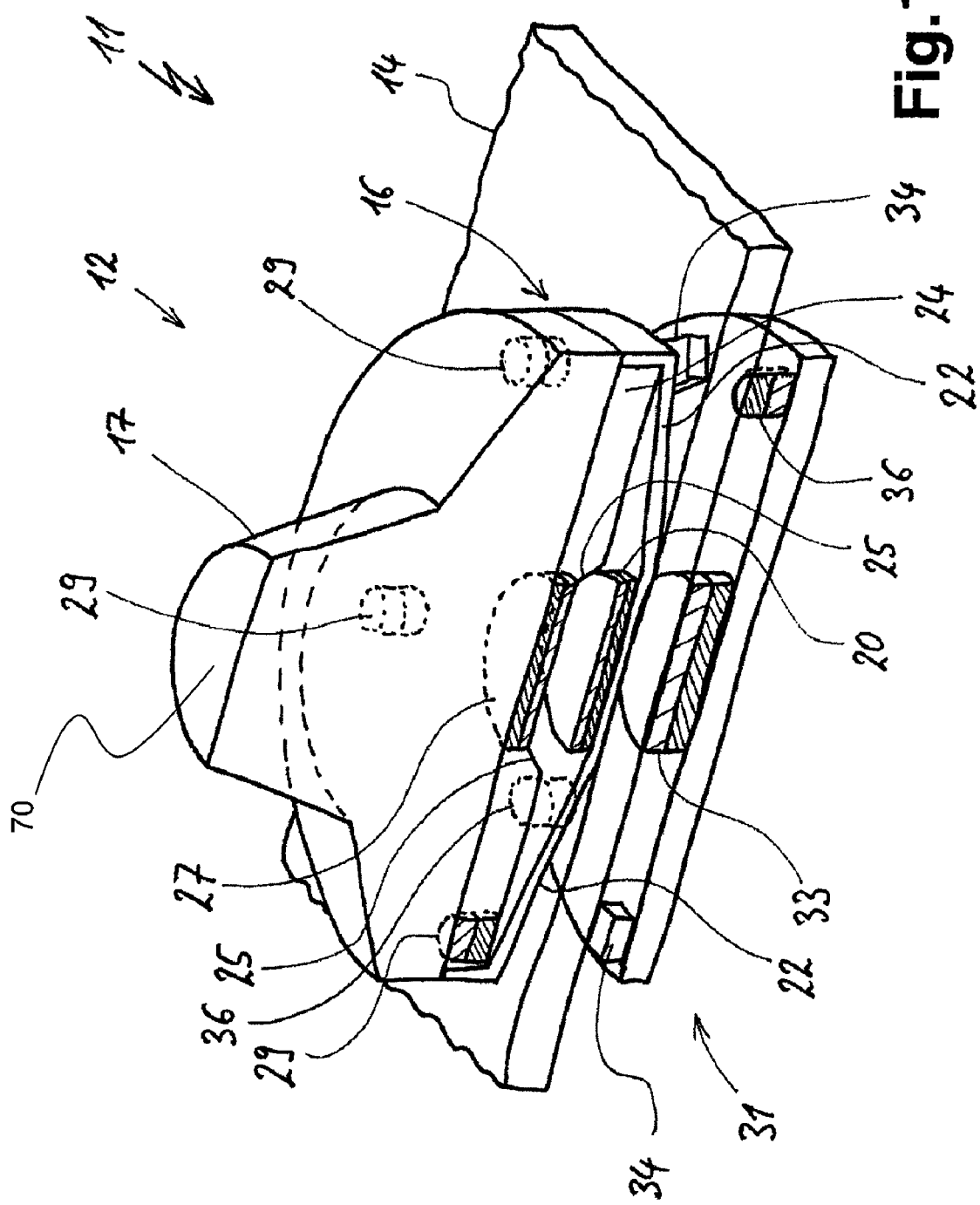

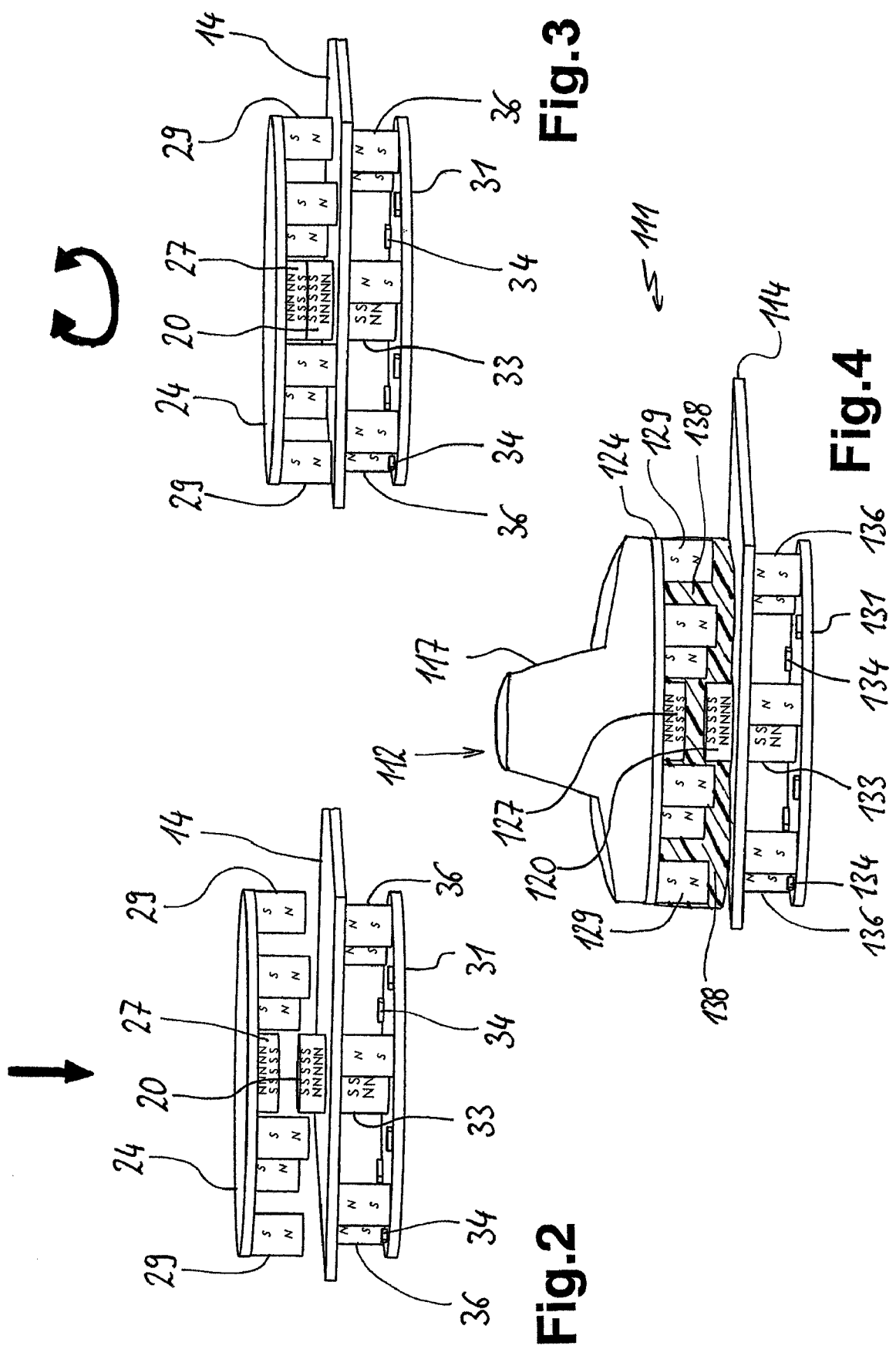

OPERATING DEVICE FOR AN ELECTRICAL APPLIANCE AND OPERATING METHOD

CROSS REFERENCE TO RELATED APPLICATIONS

This application is based on German Application No. 102006045735.8 filed on Sep. 18, 2006, of which the contents are hereby incorporated by reference.

FIELD OF INVENTION

The invention relates to an operating device for an electrical appliance, for example, an electric heating appliance such as a hob, as well as an operating method.

BACKGROUND OF INVENTION

It is known from, for example DE 20 2004 017 133 U1, to laterally displace an external operating element in the form of a magnetically held knob on a hob for a first operating function, such as indicating the selection of a hotplate. The operating element can be subsequently returned to its starting position in order to then determine by rotation the power level for the selected hotplate. Such an operating element is basically also known from U.S. Pat. No. 5,920,131 A.

The problem of the invention is to provide such an operating device and an operating method with which extended operating functions are made possible through a novel structure and a novel operation.

BRIEF DESCRIPTION OF THE DRAWINGS

Embodiments of the invention are described in greater detail hereinafter relative to the attached diagrammatic drawings, wherein show:

FIG. 1 illustrates a sectional oblique view of a first embodiment of an inventive operating device;

FIGS. 2 and 3 illustrate diagrammatic representations of arrangements of magnets and magnetic field sensors in an operating element similar to FIG. 1; and FIG. 4 illustrates another possible construction of an operating element with a lower area made from compressible material.

DETAILED DESCRIPTION OF THE EMBODIMENTS

Figure 5:
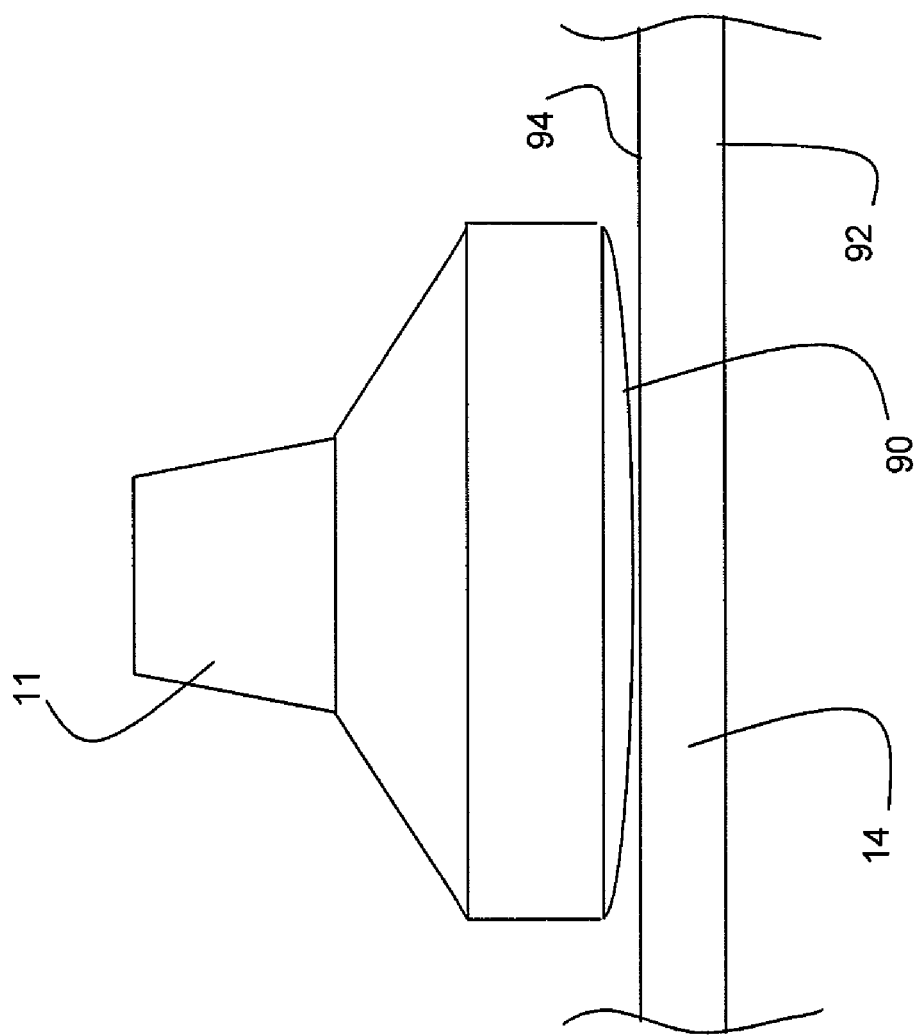
FIG. 5 illustrates a side view of the operating element of FIG. 1.

This problem is solved in one embodiment by an operating device having the features of claim 1 and an operating method having the features of claim 20. Advantageous and preferred developments of the invention form the subject matter of the further claims and are explained in greater detail hereinafter. By express reference the wording of the claims is made into part of the content of the description.

The operating element is movable, it can be rotated and/or laterally displaced or tilted for an operating function. It is removable and with an operating element underside rests on a support, which is advantageously planar and closed. According to the invention, the operating element can be variably shaped or can be so compressed that with its top face, particularly the complete top face, so that it can be pressed onto the support and consequently approaches the same. Following the detection of this pressing action on the operating element or the approach, said process can be detected and a further operating function initiated. As a result, it is possible that in addition to a movement of the complete operating element, a further operating function can be initiated by pressing on said operating element or causing the deformation of the same. Thus, an operating method can be extended or provided with additional functions. In particular, with such a pressing on the operating element operating functions such as the confirmation of a possible operating function or the activation of a process can be made intuitive. It is also possible to make an operating function a consequence of pressing several times on the operating element with a release between each pressing operation.

Advantageously, detection means are provided with which it is possible to detect the approach of the top face of the operating element to the support or the compression of the operating element in order to then initiate the associated operating function. Said detection means can be located in the operating element, so that they can directly and therefore very reliably and simply determine said compression. A corresponding signal can then be transmitted to an operating device control, for example below the support. Alternatively the detection means or at least the essential part thereof, can be placed in or below the support and at least not on or in the operating element. This permits a simpler construction of the operating element, because in particular, no electrical or electronic components have to be housed therein. Moreover, in a further development of the invention, it is possible for the detection means for detecting the pressing on the operating element to be the same as the means for initiating the further operating function and which are also able to detect another movement or operation such as a displacement or rotation of the operating element. This reduces component costs for the operating device.

On fitting in the operating element, the aforementioned detection means can be located in the central area, but can also be positioned laterally. If the detection means are located in or beneath the support, it is advantageous if they are located in an area along the outer circumference of the operating element or displaced somewhat inwards, so that they are covered by the operating element, at least in a normal or off position. If the operating element is essentially constructed for operation by rotation, it is sufficient to place the detection means in a corresponding small area, for example an arrangement in a circle being appropriate.

The detection means can be constituted by sensors, which can in particular detect in a contactless manner a movement or compression of the operating element. They can react to signal generators which are located in the operating element, or to the actual operating element without additional signal generators. A contactless detection or signal transmission can for example take place capacitively or magnetically. In the case of a magnetic signal transmission it is appropriate to construct the sensors as Hall sensors. Signal generators in the operating element can then be corresponding magnets. Such detection means are not only suitable for the detection of a compression of the operating element, but also the movement or rotation thereof.

The shape of the operating element can vary, and be such that its entire top face or its entire top part can be pressed in or compressed downwards towards the support. The top and bottom faces of the operating element are compressed or move towards one another. Thus, not only an area of the top part or top face is compressed, for example, in the manner of a knob and instead there is a large-area pressing in or down. If the operating element is, for example, divided or dividable into an upper and a lower half, a rigid, upper half can be pressed against a shape-variable, lower half.

For bringing about shape variability, elastic or bendable material can be used, for example in the form of an elastic plastics material. Said elastic or bendable material is particularly advantageously provided in the lower area of the operating element or can form the underside thereof.

In another embodiment of the invention, the shape variability of the operating element can be brought about by an elastic membrane or in that the operating element underside is constructed thin or with a thin wall. The volume bounded by it can be compressed when pressure is exerted from above on the operating element.

In a further embodiment of the invention, the underside of the operating element can be made compressible or have corresponding material. This can for example be a relatively flexible rubber, for example, in the form of a solid material. Such a compressible material can also be provided in laminar form.

In another embodiment of the invention, part of the operating element, particularly the underside, can have an articulated construction or articulated areas can be provided thereon. The joints then replace the aforementioned elastic or bendable material.

Advantageously the operating element can not only be compressed, but instead, after releasing the pressure, it can be automatically reset again. For this purpose, a resetting device can be provided, which produces a resetting or restoring force, which moves the operating element back again or presses the top face away from the support again. Such a resetting device is advantageously located between the top and bottom faces within the operating element.

According to another embodiment of the invention, a resetting device can operate with spring tension or have a spring, for example in the form of a flat disk spring or at least one helical spring. It is advantageously possible to use plastic springs, particularly also of solid, elastic plastic bodies such as foam or the like.

According to an alternative embodiment of the invention, a resetting device can operate magnetically or have magnets. To this end, between the top and bottom faces of the operating element can be positioned equidirectionally poled magnets. In the case of a pressure on the top face of the operating element, they approach one another and in certain circumstances even engage with one another. On relieving the pressure they repel one another, so that the operating element returns to its original shape. The operating element can be internally hollow for housing the magnets. It is also advantageous if the complete operating element changes or reduces volume on compression.

It is possible to hold the operating element magnetically on the support surface or is centred during a rotary or turning movement as the operating movement. For this purpose magnets can be located in the operating element and correspondingly beneath the support surface and this preferably takes place in the centre of the operating element.

Advantageously the operating element is closed or sealed to the outside. As a result neither dirt nor liquid can penetrate and either hygienically dirty the same or impair its function, particularly with respect to a possible compression. The support for the operating element can be constructed without openings or in closed form and this is particularly significant for a hob plate.

The amount by which the operating element can be compressed for initiating the operating function can range from below 1 mm to a few mm. It is advantageous if the operating path is as large as possible, so that an operator clearly feels the pressing down of the upper part leading to a haptic feedback. It is also possible to provide a small stop or locking resistance or the like, which so-to-speak defines a switching point.

An inventive operating method can be provided, which selects or confirms preset options by pressing on the operating element. In an operating method, it is possible for the provision of the pressing and release of the operating element solely in the form of an operating function. Alternatively, a movement or rotation of the operating element can take place under pressure, which then initiates a different operating function to a movement of the operating element without pressure thereon or merely pressure on the operating element without moving the same. Thus, for example by rotating or moving the operating element a specific function or option can be selected or proposed. By pressing on the operating element, there is then a final selection and acceptance as an operating function. There can then be a further selection by moving the operating element.

These and further features can be gathered from the claims, description and drawings and the individual features, both singly or in the form of subcombinations, can be implemented in an embodiment of the invention and in other fields and can represent advantageous, independently protectable constructions for which protection is claimed here. The subdivision of the application into individual sections and the subheadings in no way restrict the general validity of the statements made thereunder.

FIG. 1 is a sectional oblique view of an inventive operating device 11 with an operating element 12, which is placed in a removable manner on a support 14. Support 14 can be a hob (cooktop) plate of a glass ceramic hob, but also some other electrical appliance wall or panel. The operating device 11 is also shown in a side view in FIG. 5, where the underside 90 of the operating element rests on the support surface 14, which has an outside surface 94 and an inside surface 92.

The essential functionality of the operating element 12 is contained in a lower, wider base part 16, which passes upwards into a narrower turned part 17. Operating element 12 is a lower central magnet 20 in the form of a flat circular disk. The lower central magnet 20 rests on a membrane 22, which admittedly can be made relatively robust, but which is elastic sufficient enough to permit its deformation through the pressing down of operating element 12. The membrane 22 then engages in compressed form with an inner disk 24, which forms the lower area of base part 16 over the membrane. The inner disk 24 can be made from a strong plastics material or the like. In its central area it has an inner recess 25 constructed in such a way that it can receive the lower central magnet 20 and the said inner disk 24 rests directly on membrane 22, which is in turn pressed against support 14.

On inner recess 25, or relatively precisely above the lower central magnet 20, is located an upper central magnet 27, which can be substantially of the same size as the lower central magnet 20, but which is positioned in such a way that it is equidirectionally poled. As a result the two central magnets 20 and 27 repel each other, and this will be explained in greater detail hereinafter.

From the flat, lower area below the lower central magnet 20, membrane 22 slopes upwards and outwards and then passes into a wide border, which in turn passes into or forms part of the outer border of base part 16. On the underside of base part 16 is located the aforementioned inner disk 24 with the inner recess 25 and upper central magnet 27 therein. Moreover, within said inner disk 24 is provided a plurality of signal magnets 29, for example six such magnets. They are located in the inner disk 24 and for example, in much the same way as the upper central magnet 27, can be fixed or injection moulded therein. Alternatively they can be inserted and bonded in corresponding recesses. The remaining part of the operating element 12 and in particular also the turning piece 17 located above inner disk 24 and membrane 22 can also be made from plastic, for example in one piece.

A counterplate 31 is located below support 14 and carries a holding magnet 33, which is precisely located below the two central magnets 20, 27 and which has an opposite polarity to the lower central magnet 20, so that the two magnets attract. As is known from the aforementioned prior art, holding magnet 33 is used for holding the operating element 12 on support 14. It also effectively forms a rotation axis, so that during rotation the operating element 12 does not normally slide laterally. Once again the counterplate 31 can be made from plastic and holding magnet 33 can be placed thereon. Alternatively, the holding magnet can be partly or wholly embedded therein, for example cast or moulded therein. The counterplate 31 can also be a printed circuit board with electrical or electronic components, for example also a control.

Around the holding magnet 33 are provided with the same spacing as the upper signal magnets 29 with respect to central magnets 20, 27, Hall sensors 34 for detecting magnetic field changes. There can be two such sensors according to FIG. 1, but sometimes even more. These Hall sensors 34 record changes to the magnetic field if during a rotation of the operating element 12 the signal magnets 29 move away from or approach the same. This makes it possible to determine a rotation angle covered, such as is known from the prior art. The counterplate 31 also carries stop magnets 36 on the same circle or with the same spacing with respect to the holding magnet 33. These stop magnets 36 cooperate with the signal magnets 29 in such a way that they repel as a result of the equidirectional polarity. Whilst the repulsion between central magnets 20, 27 presses the upper part of operating element 12 upwards and away from support 14, this only partly applies for signal magnets 29 and stop magnets 36. They also repel one another during a rotation in the circumferential direction in such a way that the resistance to be overcome increases the closer a signal magnet 29 comes to a stop magnet 36 during the rotation. Thus, a magnetic stopping or locking action can be provided in the form of a haptic feedback to an operator, as is known from the prior art. In place of the presently described six signal magnets 29 and Hall sensors 34, as well as stop magnets 36, other numbers of magnets, sensors, and stop magnets can be used.

Function

The function of an operating device 11 according to FIG. 1 is additionally illustrated by FIGS. 2 and 3. In a diagrammatic, simplified form FIGS. 2 and 3 only show the magnets, Hall sensors 34, upper inner disk 24 and counterplate 31 on a support 14.

The central magnets 20 and 27 are apart in FIG. 2. This pressing apart can besides the magnetic repelling force also be favoured by the compression spring-like properties of membrane 22, so that two forces press upwards again the upper part of operating element 12 away from support 14. In the relieved state according to FIG. 2, operating element 12 can be rotated for an operation. This rotation can be detected on Hall sensors 34, because the signal magnets 29 move past the same and consequently on the Hall sensors there is a varying field strength. The centering or holding of operating element 12 on support 14 takes place through the lower central magnet 20, which is held by holding magnet 33. The indicated polarities are only exemplified and can be changed. The polarity of the positioning and stop magnets relative to the polarity of the holding magnets is also of an exemplified nature and can also be reversed.

If operating element 12 is compressed or the turning piece 17 is moved towards support 14, the diagrammatic configuration shown in FIG. 3 is obtained. Operating element 12 is compressed to such an extent that the two central magnets 20, 27 engage on one another, but this does not need to be so extensive. The signal magnets 29 approach support 14, for example to the extent that they press directly against membrane 22, which in turn pressed directly against support 14. A detection of the rotation of operating element 12 takes place in the manner described hereinbefore, i.e., by a varying, initially decreasing, magnetic field strength on Hall sensors 34. However, the Hall sensors can also detect that the magnetic field is stronger than in the configuration according to FIG. 2, because here the signal magnets 29 are significantly closer. Since in the case of an overall pressing down of the operating element 12 this change is indicated on all the Hall sensors 34, this can be readily recognized by a controller or processor connected to the sensors (not shown). In a similar manner it is also possible to establish when the pressure on operating element 12 is reduced, so that it again moves upwards and the magnetic field strength on Hall sensors 34 becomes weaker again. Thus, throughout the entire time, a rotary movement can be evaluated, as can the pressing and release actions. A rotary movement with pressed down operating element 12 can represent some other operation or initiate a function differing from the normal rotary movement.

According to another operation, the operating element 12 can be laterally tilted or pressed down only on one side, i.e. tilted similar to a joystick (not shown). Inner disk 24 with signal magnets 29 does not then uniformly approach the lower part, particularly on one side. This can also be detected on Hall sensors 34, because then only on one Hall sensor, or in certain circumstances two Hall sensors, is there a detection of a clear change to the field strength as an increase, accompanied by a simultaneous anti-phase change on the opposite side. Such a tilting of the operating element 12 is advantageously provided as an individual operation without rotation, similar to pressing on a button. Thus, operating element 12 is firstly tilted for a corresponding operating function and then returns to its starting position and can subsequently either be pressed downwards again or rotated.

Based on the diagrammatic representations of FIGS. 2 and 3, FIG. 4 shows a variant, where no flexible membrane 22 according to FIG. 1 is provided and instead the area below inner disk 124 is largely filled with elastic, compressible material, for example foam and for which two possibilities are conceivable. In a first possibility, there is a complete filling of the lower area with foam, so that the magnets of operating element 112 are completely embedded therein. Thus, the foam 138 is located also between signal magnets 129 and support 114 and also between upper central magnet 127 and lower central magnet 120. Normally this foam 138 has such a high inherent elasticity that it is sufficient to press apart the operating element from the compressed form after relieving the pressure back into the initial form. In certain circumstances it is also possible to do away with the upper central magnet 127, which is only there in embodiment in order to press apart again the operating element with its repelling force with respect to the lower central magnet 120.

In an alternative embodiment, below the signal magnets 129 and between the central magnets 120, 127 could be provided in foam 138 recesses for the said magnets. The operating element 112 can then be pressed further towards support 114, which is advantageous for signal detection on Hall sensors 134. This would also reduce wear to the foam material 138.

The outer surface of foam 138 can be coated or enveloped for a higher mechanical loading capacity, for example with a robust, elastic rubber layer or the like.

Figure 6:
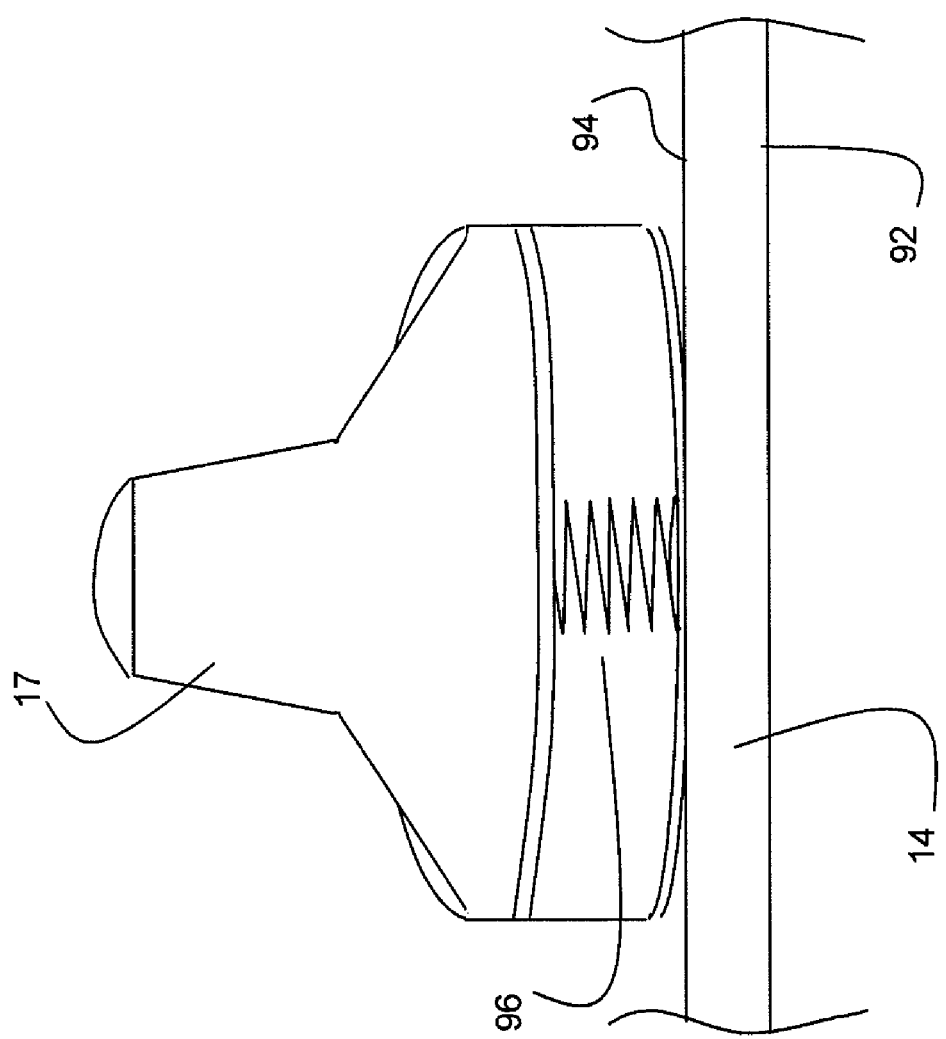
FIG. 6 illustrates a cross sectional side view of another embodiment of the resetting means.

As a further alternative to the central magnets or foam, use can be made of a helical spring in an operating element similar to FIG. 1, for example in place of the upper central magnet or several helical springs or plastic springs outside between the signal magnets as shown in one embodiment of the helical spring 96 shown in FIG. 6. In this embodiment as well, the operating device 17 rests on the support surface 14, which has an outside surface 94 and an inside surface 92.

The invention claimed is:

1. An operating device for an electrical appliance comprising an electric hob, said operating device having at least one operating element for indicating operating functions, said operating element being movable and resting in a removable manner on a support of said electrical appliance in contact with an underside of said operating element, wherein said operating element is constructed in a shape-variable manner wherein elastic or bendable material is provided on said operating element for achieving said shape variability such that a lower portion of said operating element alters its shape upon pressing a top face towards said support and therefore presses said support against said underside, said operating element configured such that pressing said top face initiates an operating function as a result of detection of said pressing or said approach.

2. The operating device according to claim 1, wherein said approach of said top face of said operating element or said compression of the operating element is detected by detection means for initiating said operating function.

3. The operating device according to claim 2, wherein said detection means are at least partly located below said support in said electrical appliance.

4. The operating device according to claim 1, wherein said pressing down of said top face of said operating element compresses said operating element and is detected by detection means for said operating function, wherein said detecting means are the same as for detecting other operating functions of said operating device.

5. The operating device according to claim 4, wherein said detection means comprise a plurality of sensors positioned below said operating element and reacting to signal generators in said operating element.

6. The operating device according to claim 5, wherein said sensors are magnetic Hall sensors and said signal generators in said operating element are magnets.

7. The operating device according to claim 1, wherein said elastic or bendable material is provided in said lower portion of said operating element.

8. The operating device according to claim 1, wherein said operating element underside is an elastic membrane, a volume bounded by it being compressible by pressure on said top face of said operating element for compressing said operating element or for approach to said support.

9. The operating device according to claim 1, wherein a resetting device is provided for producing a resetting force for moving back said operating element or said top face of said operating element away from said support.

10. The operating device according to claim 9, wherein said resetting device is positioned between said operating element underside and said top face of said operating element in such a way so that when pressure is applied, said operating element is compressed, and when said pressure is relieved as a result of said resetting force, said operating element returns to its original shape or position.

11. The operating device according to claim 9, wherein said resetting device operates with a spring mechanism.

12. The operating device according to claim 9, wherein said resetting device operates with one or more magnets.

13. The operating device according to claim 12, wherein between said operating element underside and said operating element top face are provided two oppositely poled magnets, which approach one another when pressure is exerted on said operating element top face and repel when said pressure is relieved so that said operating element returns to its original shape.

14. The operating device according to claim 1, wherein said operating element is closed or sealed to an outside.

15. The operating device according to claim 1, wherein said support is unperforated or closed.

16. An operating method for a detachable operating device for an electrical appliance having at least one operating element for indicating at least one operating function, said operating device resting in a removable manner on a support of said electrical appliance in contact with an underside of said operating element, wherein said operating element has a top face and is constructed in a manner so as to be capable of having a shape altered when said top face is pressed in or pressed towards said support thereby causing an elastic or bendable material provided on a lower portion of said operating element to alter said shape, wherein said pressing of said top face further indicates said operating function, comprising the step of:

pressing the top face of the operating element thereby causing the shape to be altered, and further causing said top face to approach said support thereby indicating said operating function.

17. The operating method according to claim 16, wherein the step of pressing the top face of the operating element thereby causing the shape to be altered, and further causing said top face to approach said support thereby indicating said operating function comprises the steps of:

a) pressing the top face of the operating element thereby causing the shape to be altered, and further causing said top face to approach said support; and b) releasing the top face of the operator element thereby causing said top face to move away from said support, thereby indicating said operating function.

18. The operating method according to claim 17, wherein a second operating function is indicated upon the completion of repeating the steps of a) and b).

19. The operating method according to claim 16, further comprising the step of:

rotating or moving said operating element wherein said rotation or movement indicates a second operating function.

20. The operating method according to claim 16, wherein a specific function or option is selected or proposed via rotation or movement of said operating element, and by pressing on said operating element a final selection and acceptance as an operating function takes place.

21. An operative device for an appliance comprising:

a removable operating element having a circular shape about an axis of rotation, said operating element having an underside resting on a location of a surface of said appliance, said surface of said appliance having an outside surface and an inside surface, said operating element comprising:

a first circular magnet oriented parallel to the outside surface, said first circular magnet positioned about said axis of rotation, and a plurality of magnets positioned in a circle about said axis of rotation, said plurality of magnets functioning as a plurality of signal sources, wherein said operating element is constructed so as to vary its shape when pressure from a user is applied pressing said operating element onto said surface of said appliance in such a way that said operating element alters its shape upon a top face being pressed in or pressed towards said support and said support is therefore pressed against said underside of said operating element thereby causing an elastic or bendable material on a lower portion of said operating element to alter its shape;

a second circular magnet positioned about said axis on or near said inside surface parallel to said first circular magnet, said second circular magnet functioning to interact with said first circular magnet so as to hold said removable operating element on said location of said surface; and a plurality of sensors located in said circle around said axis of rotation positioned on or near said inside surface of said appliance operable to detect a change of said signal sources associated with either a rotational movement of said removable operating element or the application of pressure from said user on said operating element thereby causing said operating element to vary its shape.

22. An operating device for an electrical appliance comprising an electric hob, said operating device having at least one operating element for indicating operating functions, said operating element being movable and resting in a removable manner on a support of said electrical appliance in contact with an underside of said operating element, wherein said operating element is constructed in a shape-variable manner having a top face such that pressing said top face towards said support causes said top face to approach said support and causes a lower portion of said operating device to alter its shape as a result of a compressible construction of said lower portion comprising compressible material comprising rubber or foam, said operating device configured to initiate an operating function as a result of detection of said pressing or said approach.

* * * * *